(12) United States Patent
Sabnis et al.

(10) Patent No.: US 7,449,230 B2
(45) Date of Patent: Nov. 11, 2008

(54) LITHOGRAPHY PATTERN SHRINK PROCESS AND ARTICLES

(75) Inventors: Ram W. Sabnis, Evansville, IN (US); James E. Lamb, III, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 456 days.

(21) Appl. No.: 11/063,411

(22) Filed: Feb. 23, 2005

(65) Prior Publication Data
US 2005/0147901 A1 Jul. 7, 2005

Related U.S. Application Data

(62) Division of application No. 10/378,435, filed on Mar. 3, 2003, now Pat. No. 7,122,296.

(51) Int. Cl.
*B32B 3/30* (2006.01)
(52) U.S. Cl. .................................... 428/166
(58) Field of Classification Search ................. 428/166
See application file for complete search history.

(56) References Cited

U.S. PATENT DOCUMENTS

| | | | |
|---|---|---|---|
| 4,256,514 A | 3/1981 | Pogge | |
| 4,838,991 A | 6/1989 | Cote et al. | |
| 5,017,515 A | 5/1991 | Gill | |
| 5,362,812 A | 11/1994 | Holmes et al. | |
| 5,618,379 A | 4/1997 | Armacost et al. | |
| 5,651,857 A * | 7/1997 | Cronin et al. | 438/696 |
| 5,863,707 A | 1/1999 | Lin | |
| 5,895,740 A | 4/1999 | Chien et al. | |
| 5,981,148 A * | 11/1999 | Brown et al. | 430/314 |
| 6,048,799 A | 4/2000 | Prybyla | |
| 6,406,544 B1 | 6/2002 | Stewart | |
| 6,815,043 B2 * | 11/2004 | Fleming et al. | 428/161 |
| 2002/0093122 A1 | 7/2002 | Choi et al. | |
| 2003/0003401 A1 | 1/2003 | Willshire | |
| 2003/0044726 A1 | 3/2003 | Chen et al. | |

* cited by examiner

*Primary Examiner*—William P Watkins, III
(74) *Attorney, Agent, or Firm*—Hovey Williams LLP

(57) ABSTRACT

Novel processes of applying a thin, uniform, conformal organic polymeric film by a wide variety of deposition processes into lithography pattern substrates are provided. The inventive processes result in shrinking of the gaps in the lithography pattern equally, thus producing a smaller dimension. The amount of pattern shrinkage is selectively controlled by controlling the deposition rate to provide the desired final structure dimension. A wide variety of organic films is used as materials for these films. The inventive methods are applicable to any patterning technique used in lithography to provide a reduction in pattern sizes. Examples of the applicable device levels include the production of gate layers, ion implantation of active device layers and substantive metal layers, dielectric patterning, interconnect processes produced by damascene, dual damascene, backend packaging layers, and devices requiring multiple layers deposited by electrodeposition, CVD or sputtering. The inventive methods are useful for providing highly conformal coatings on large surface substrates having super submicron (i.e., 0.15 μm or smaller) features. The process is environmentally friendly and relatively low cost compared to other options.

12 Claims, 8 Drawing Sheets

LITHOGRAPHY PATTERN SHRINK PROCESS AND ARTICLES

RELATED APPLICATIONS

This application is a divisional of U.S. patent application Ser. No. 10/378,435, filed Mar. 3, 2003 which issued on Oct. 17, 2006, as U.S. Pat. No. 7,122,296, incorporated by reference herein.

BACKGROUND OF THE INVENTION

1. Field of the Invention

The present invention is directed towards methods of forming thin uniform films on lithography pattern substrates, shrinking all gaps in the lithography pattern, and equally producing a smaller dimension. It particularly relates to the selective deposition of organic polymeric films by chemical vapor deposition (CVD) and plasma enhanced chemical vapor deposition (PECVD).

2. Description of the Prior Art

The escalating requirements for high-density and performance associated with ultra large-scale integration semiconductor wiring require responsive changes in interconnection technology. Such escalating requirements have been difficult to satisfy in terms of providing a low RC (resistance capacitance) interconnection pattern, particularly where sub-micron via contacts and trenches have high aspect ratios imposed by miniaturization. In microlithography, patterning state of the art printing is reaching many fundamental limits. The processes have used progressively lower wavelength exposure tools to provide smaller pattern printing, thus allowing increased device density for semiconductors. However, this has been done at a great cost requiring large investments into long-term research. With the advances to lower wavelengths for photolithography, new exposure tools, lens materials, mask materials, and resist materials are required. As each new generation of reduced wavelength equipment is introduced, there is subsequently a marked need for technical advances in tools, materials, and processes of the previous photolithography generations. As a result, the window of usefulness of the already-installed, older generations of photolithography equipment has been greatly reduced and, in fact, this equipment may even be rendered obsolete by these advancements.

There is a need for an improved, simple and low-cost process for shrinking lithography gap. There is also a need for the precise reduction of lithography gap by applying highly conformal films in an economical manner.

SUMMARY OF THE INVENTION

This present invention is broadly concerned with methods of extending the useful resolution range for photolithography, independent of the lithography tool generation being used or any other lithography enhancement techniques being applied.

In more detail, the present invention provides methods of reducing the gap size in substrates having submicron features. In patterned substrates (i.e., substrates having via holes, contact holes, and/or trenches formed therein), the gap size refers to the width of the holes or trenches. With substrates having raised features formed thereon, the gap size refers to the distance between raised features.

In the inventive processes, a thin, highly conformal layer of organic material is applied to the substrate surface so that it evenly coats the substrate upper surfaces as well as the sidewalls and bottomwalls of any trenches or holes. In situations where the substrate includes raised features, the thin, highly conformal layer of organic material is applied to the sidewalls and uppers surfaces of any raised features as well as to the bottomwalls between the raised features. The bottomwalls (and optionally the upper substrate surfaces or upper feature surfaces) are then subjected to a removal process (e.g., etch back) to remove the material therefrom. The removal process is carried out for a time period of at least about 1 second, preferably from about 1 second to about 1 minute, and more preferably from about 4-10 seconds. The gap remaining after the removal step is smaller or more narrow than the initial gap, and the structure can then be subjected to further processing (e.g., pattern transfer steps, metal deposition, etc.).

This process is applicable to any patterning technique used in lithography to provide a reduction in pattern size. Examples of applicable device levels include ion implant layers, gate layers, interconnect processes produced by damascene and dual damascene, subtractive metal layers, and dielectric patterning. This process is also applicable to back-end packaging layers as well as devices requiring multiple layers of deposited films. The inventive methods are useful for providing highly conformal coatings on large surface substrates having super submicron (0.15 µm or smaller) features. The invention provides a much simpler process with higher performance standards and superior environmental safety. Finally, processes according to the invention result in a high product yield and require relatively lower manufacturing and processing times at a relatively lower costs, thus providing significant advantages over the prior art.

DETAILED DESCRIPTION OF THE PREFERRED EMBODIMENTS

Materials

Figure 1:
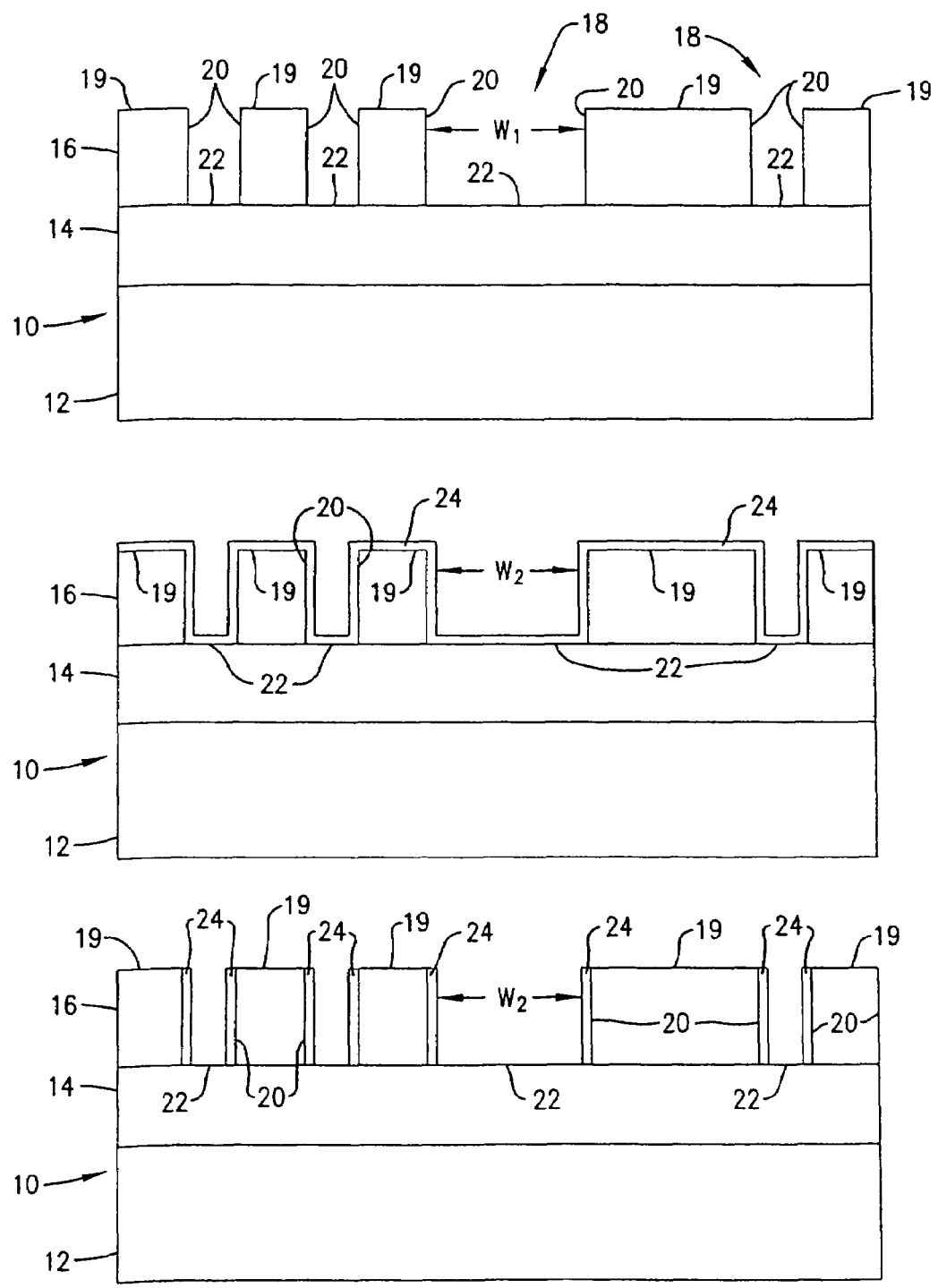
FIG. 1 is a flow diagram illustrating an inventive lithographic pattern shrink process of the gaps in the lithography pattern.

Specific families of organic, polymeric and organometallic materials can be designed, and in some cases selectively synthesized, to improve deposition rates, film uniformity and yield specific dielectric properties. Preferred monomers comprise a light attenuating moiety/moieties attached to varied functionalities. Preferred light attenuating moieties comprise cyclic structures such as benzene, naphthalene, anthracene etc. Preferred light attenuating moieties comprise heterocyclic structures such as furan, thiophene, pyrrole, pyridine, pyrimidine, pyrazine, thiazine, oxazine, acridine, thiazole, pyrazole, oxazole, quinazoline, and quinoxaline. Preferred light attenuating organometallic moieties include organic chromophores attached to silicon, titanium, germanium, tin, tungsten, lead, iron, cobalt, copper, magnesium, manganese, nickel, phosphorous, and aluminum. Preferred functionalities include alkyl, aryl, alkoxy, alicyclic, hetaryl, halogens, cyano, ester, ether, aldehydes, ketones, alcohol, phenol, nitro, amines, amides, acetamido, and unsaturated (double and triple bond) functionalities. Preferred monomers also include carbon chains, preferably $C_1$-$C_{20}$. The monomers will preferably have a melting or boiling point of less than about 450° C., preferably less than about 200° C., more preferably less than about 150° C., and even more preferably from about 10-100° C. The most preferred monomers for deposition include 2-fluorotoluene and parylene D.

Methods

In more detail, the PECVD process of the inventive methods preferably comprise converting a quantity of monomer (which can be in the solid, liquid, or gas state) into a plasma state by applying power to the monomer under vacuum. This is preferably accomplished by decreasing the pressure of the system to about 5-1000 mTorr, more preferably to about 25-150 mTorr, and most preferably to about 25-100 mTorr. The RF plasma power should be set around 1-300 watts, more preferably about 55-150 watts, and most preferably about 60-80 watts, and the mode can be pulsed (i.e., on/off mode, not continuous) or not pulsed at a duty cycle of about 30%. The system is preferably under gas (e.g., an inert gas such as argon gas). The gas flow rate is generally kept around 0-50 sccm, more preferably about 20-40 sccm, and most preferably about 30 sccm.

In the following examples the monomers were vaporized in a plasma state in a quartz chamber, and then polymerized and deposited in a deposition chamber onto dense (1:1), semi-dense (1:2), and isolated (1:4) blank resist patterned 0.25-μm sized via holes and 7000 Å (1:1) topography wafers by the PECVD process. The substrate is preferably rotated at about 0-10 rpm in order to ensure a uniform coat, more preferably at about 4-8 rpm, and most preferably at about 6 rpm.

The CVD process of the inventive methods preferably comprises subjecting a monomer (which can be in the solid, liquid, or gas state) to sufficient temperature and pressure so as to cause the monomer to sublime to form a vapor. This is preferably accomplished by heating the monomer to a temperature (sublimation temperature) of about 0-450° C., more preferably from about 60-150° C., and most preferably from about 100-125° C., at a base pressure of from about 5-1000 mTorr, more preferably from about 25-150 mTorr, and most preferably from about 25-75 mTorr. The resulting vapors are then subjected to a process whereby the precursors in the vapor phase are cleaved. This cleavage is generally carried out in a pyrolysis chamber by heating from about 450-1000° C., more preferably from 500-800° C., and most preferably from 600-650° C.

The process can be performed with or without an inert gas (e.g., argon). The gas flow rate is preferably kept at about 10-50 sccm, more preferably at about 20-40 sccm, and most preferably at about 30 sccm. Finally, the cleaved compounds, radicals, ions were caused to polymerize in deposition chamber onto dense (1:1), semidense (1:2), and isolated (1:4) blank resist patterned 0.25-μm sized via holes and 7000 Å (1:1) topography wafers by the CVD process. The substrate was rotated at about 0-10 rpm in order to ensure a uniform coat, more preferably at about 4-8 rpm, and most preferably at about 6 rpm.

FIG. 1 schematically depicts one embodiment of the inventive gap shrink process. A substrate stack 10 is provided. Stack 10 comprises a substrate 12, an optional underlying film 14, and a photoresist layer 16. Substrate 12 can comprise a material selected from the group consisting of silicon, aluminum, tungsten, tungsten silicide, gallium arsenide, germanium, tantalum, tantalum nitrite, mixed metal salts, and SiGe.

As shown, photoresist layer 16 is patterned to include vias or trenches 18 and upper surfaces 19. The vias or trenches 18 have respective sidewalls 20 and bottomwalls 22. Each via or trench has an initial width "$W_1$." In the next step, a thin, conformal layer 24 of an organic material is applied (e.g., via CVD, PECVD, physical vapor deposition, atomic layer deposition, electron beam irradiation, and ultraviolet light irradiation processes) to the upper surfaces 19, sidewalls 20, and bottom walls 22. The thickness of layer 24 will typically be from about 10-2,000 Å, and more preferably from about 100-500 Å. It will be appreciated that the thickness can be controlled by the deposition rate which is preferably from about 20-2,000 Å/min., more preferably from about 50-1,000 Å/min., and even more preferably from about 100-300 Å/min.

The layer 24 deposited according to the invention is highly conformal, even on topographic surfaces (as used herein, surfaces having raised features of about 2,000 Å or greater and/or having contact or via holes or trenches formed therein and having hole depths of about 10,000 Å or greater). Thus, the deposited layer 24 has a percent conformality of at least about 40%, preferably at least about 60%, and more preferably from about 85-100%, wherein the percent conformality is defined as:

$$100 \cdot \frac{|(\text{thickness of the film at location } A) - (\text{thickness of the film at location } B)|}{(\text{thickness of the film at location } A)},$$

wherein: "A" is the centerpoint of the top surface of a target feature when the target feature is a raised feature, or the centerpoint of the bottom surface of the target feature when the target feature is a contact or via hole; and "B" is the halfway point between the edge of the target feature and the edge of the feature nearest the target feature. When used with the definition of percent conformality, "feature" and "target feature" is intended to refer to raised features as well as contact or via holes. As also used in this definition, the "edge" of the target feature is intended to refer to the base of the sidewall forming the target feature when the target feature is a raised feature, or the upper edge of a contact or via hole when the target feature is a recessed feature.

Again referring to FIG. 1, in the third step of the process the conformal layer 24 is preferably subjected to a directional etch back process (e.g., by plasma etch) to remove substantially all (i.e., at least about 98%, and preferably about 100%) of the portions of layer 24 that are bottomwalls 22, but excluding that portion of layer 24 which is a part of the layer 24 on sidewalls 20. This results in each via or trench having a second width "$W_2$" which is smaller than $W_1$. Preferably, $W_2$ is at least about 5% smaller than $W_1$, more preferably from about 50-99% smaller than $W_1$, and even more preferably from about 30-50% smaller than $W_1$. While the foregoing discussion with respect to FIG. 1 focuses on situations where the width of the vias or trenches is being reduced by the inventive processes, it will be appreciated that this process is also applicable to substrates having raised features where it is necessary to decrease the distance or gap between features. In these instances, the distance between features can be reduced by the same amounts as the via or trench width reduction. Finally, while FIG. 1 illustrates a situation where the process was carried out to reduce gaps in a patterned photoresist, the process can also be used to reduce the gap size for a number of other types of layers and materials. Some of these include ion implant layers, dielectric layers, microelectronic wafers, and microelectromechanical systems (MEMS) structures and functional surfaces of MEMS or other microdevices.

EXAMPLES

The following examples set forth preferred methods in accordance with the invention. It is to be understood, however, that these examples are provided by way of illustration and nothing therein should be taken as a limitation upon the overall scope of the invention.

Example 1

Deposition of 2-fluorotoluene by PECVD on Via Wafers

Figure 2A:
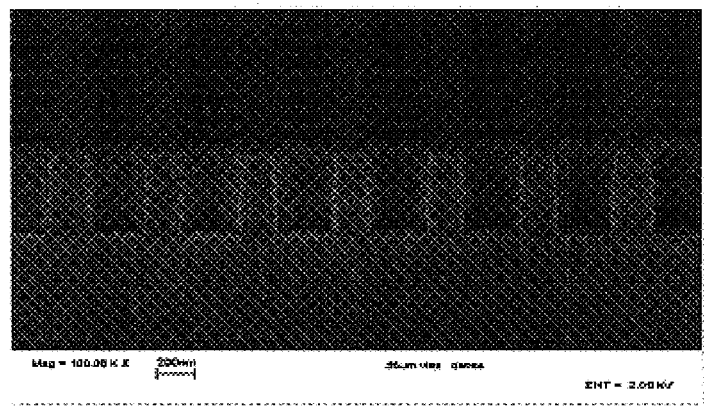
FIG. 2(a) is a scanning electron microscope (SEM) photograph showing dense (1:1) blank vias of 0.25 µm feature size.
Figure 2B:
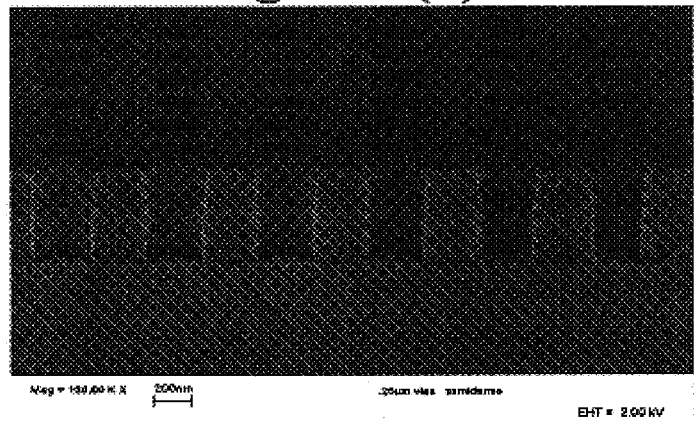
FIG. 2(b) is an SEM photograph showing semidense (1:2) blank vias of 0.25 µm feature size.
Figure 2C:
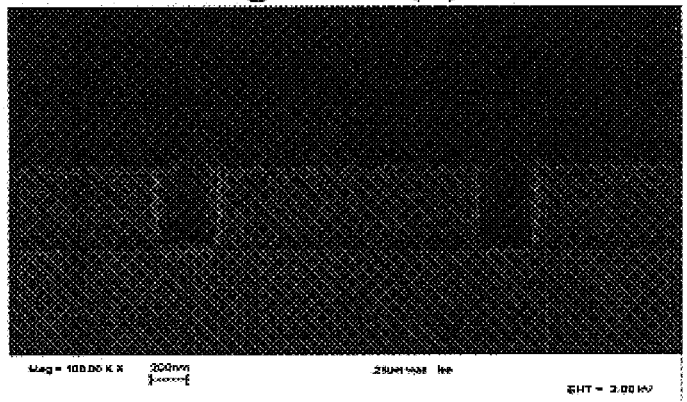
FIG. 2(c) is an SEM photograph showing isolated (1:4) blank vias of 0.25 µm feature size.

Organic, polymeric thin films were prepared by polymerizing 0.2 g of 2-fluorotoluene (Structure A, obtained from Sigma-Aldrich Company) onto dense (1:1), semidense (1:2), and isolated (1:4) blank resist patterned 0.25 μm sized via holes by a plasma enhanced chemical vapor deposition (PECVD) process. During deposition, the pressure was maintained at around 30-35 mTorr, and the temperature was room temperature (about 23° C.). The RF plasma power was set at 33 watts with pulsing at 100/50 (on/off) msec. The gas flow rate was maintained at 30 sccm using argon gas. The substrate was rotated at 6 rpm in order to ensure a uniform coat. The 2-fluorotoluene was deposited at a rate of 140 Å/min. These samples are shown in FIGS. 2(a)-(c).

Example 2

Deposition of 2-fluorotoluene by PECVD on Topography Wafers

Figure 3A:
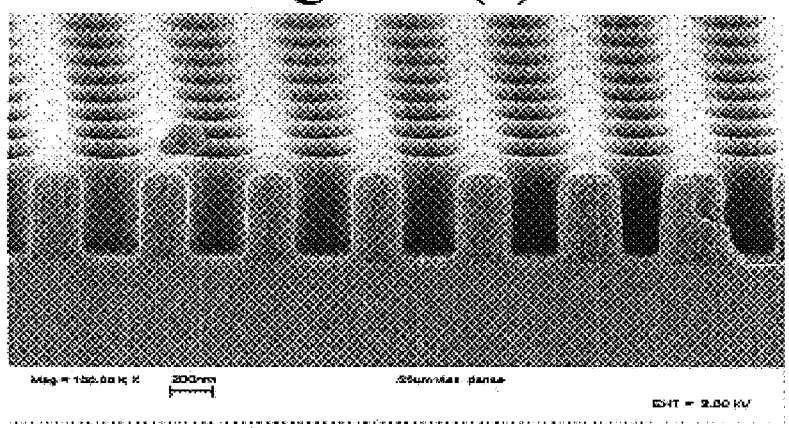
FIG. 3(a) is an SEM photograph showing dense (1:1) coated vias with 2-fluorotoluene by the inventive PECVD process.
Figure 3B:
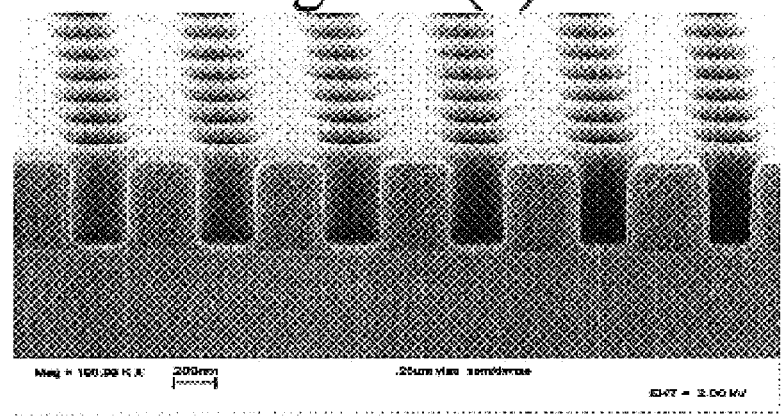
FIG. 3(b) is an SEM photograph showing semidense (1:2) coated vias with 2-fluorotoluene by a PECVD process.
Figure 3C:
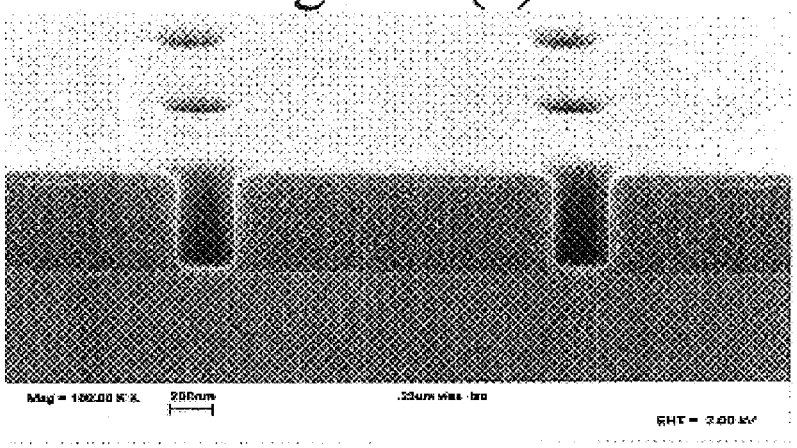
FIG. 3(c) is an SEM photograph showing isolated (1:4) coated vias with 2-fluorotoluene by the inventive PECVD process.

Organic, polymeric thin films were prepared by polymerizing 0.2 g of 2-fluorotoluene onto 7000 Å (1:1) topography wafers by a PECVD process. During deposition, the pressure was maintained around 25 mTorr, and the temperature was room temperature (about 23° C.). The RF plasma power was set at 60 watts with pulsing at 100/50 (on/off) msec. The gas flow rate was maintained at 30 sccm using argon gas. The substrate was rotated at 6 rpm in order to ensure a uniform coat. The 2-fluorotoluene was deposited at a rate of 150 Å/min. These samples are shown in FIGS. 3(a)-(c).

Example 3

Deposition of Parylene D by CVD on Via Wafers

Organic, polymeric thin films were prepared by polymerizing 0.2 g of parylene D (Structure B, obtained from Speciality Coatings Company) onto dense (1:1), semidense (1:2), and isolated (1:4) blank resist patterned 0.25 μm sized via holes by a chemical vapor deposition (CVD) process. During deposition, the pressure was maintained around 50 mTorr. The sublimation temperature was maintained at 125° C. while the pyrolysis temperature was maintained at 550° C. The substrate was rotated at 6 rpm in order to ensure a uniform coat. The parylene D was deposited at a rate of 50 Å/min.

Example 4

Deposition of Parylene D by CVD on Topography Wafers

Organic, polymeric thin films were prepared by polymerizing 0.2 g of parylene D onto 7000 Å (1:1) topography wafers by a CVD process. During deposition, the pressure was maintained around 50 mTorr. The sublimation temperature was maintained at 125° C. while the pyrolysis temperature was maintained at 550° C. The substrate was rotated at 6 rpm in order to ensure a uniform coat. The parylene D was deposited at a rate of 50 Å/min.

Example 5

Etch Back Process

After the CVD/PECVD deposition step, a highly directional, dry plasma etch back process can be performed to remove the deposited film from the surface and base of the original resist pattern structure, thus leaving the film only deposited on the sidewalls of the patterns. This provides the desired shrinkage in the pattern. The standard pattern transfer of the pattern to the substrate can be obtained by etching the underlying surface. The resist material and the remaining CVD/PECVD film will then be removed from the substrate leaving the desired device layer.

Figure 4A:
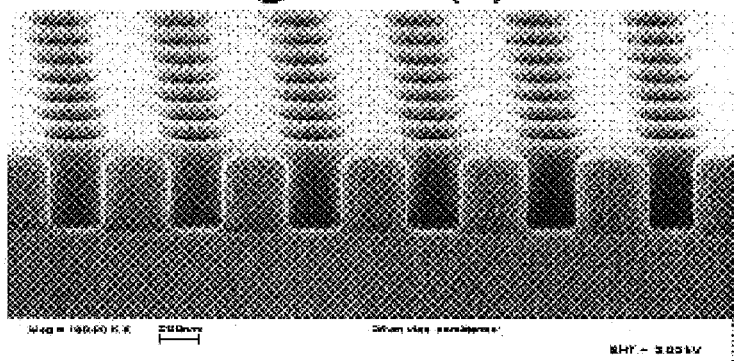
FIG. 4(a) is an SEM photograph showing an etched, semi-dense (1:2) vias after coating with 2-fluorotoluene by the inventive PECVD process and after 2 seconds of etching.
Figure 4B:
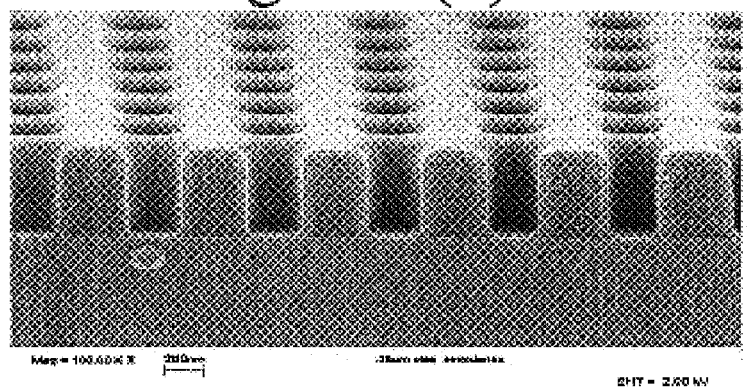
FIG. 4(b) is an SEM photograph showing an etched, semi-dense (1:2) vias after coating with 2-fluorotoluene by the inventive PECVD process and after 4 seconds of etching.
Figure 4C:
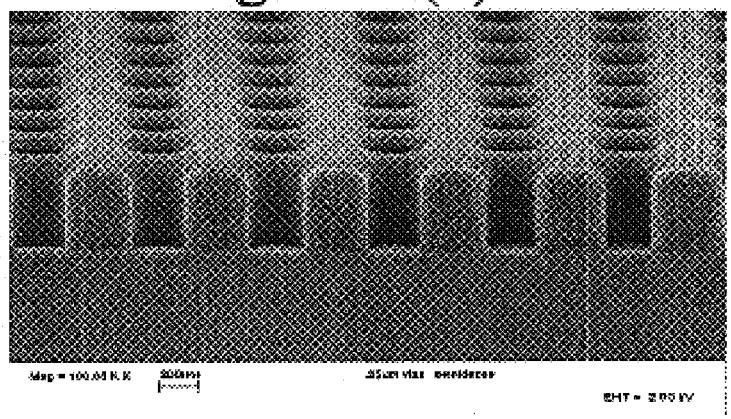
FIG. 4(c) is an SEM photograph showing an etched, semi-dense (1:2) vias after coating with 2-fluorotoluene by the inventive PECVD process and after 10 seconds of etching.

FIGS. 4(a)-(c) are photographs showing 2-second, 4-second, and 10-second isotropic etching of semidense (1:2) vias after coating with 2-fluorotoluene by a PECVD process such as that described with respect to FIG. 2(b). The dimensions were measured using NIH image software. The etching was performed for 2-second, 4-second, 5-second, and 10-second intervals, respectively. The detailed dry etching results are given in Table 1. Table 1 shows the deposition process reduced the feature size from 294 nm to 273 nm.

TABLE 1

Etching Study

| | Height of film at bottom midpoint (nm) | Feature size (nm) | Height of photoresist + film from the substrate (nm) |
|---|---|---|---|
| Photoresist via without coat (FIG. 2(b)) | — | 294 | 550 |
| Coated via (FIG. 3(b)) | 20 | 273 | 589 |
| Etched 2 sec (FIG. 4(a)) | 15 | 274 | 585 |
| Etched 4 sec (FIG. 4(b)) | 0 | 273 | 590 |
| Etched 10 sec (FIG. 4(c)) | Nothing left | 280 | 530 |

It can also be seen from FIG. 3(b) that the deposited film was thicker (39 Å) on the top of the photoresist structures, whereas it was only 20 Å at the bottom of the feature. This difference allows the material built up on the bottom of the structure to be removed by etching while leaving a layer of deposited material remaining on the top to enhance the resist structures as shown in FIG. 4(b). It is also notable that the coating process reduced the uneven surface of the interior of the via to a smoother and more beneficial state.

Example 6

Effect of Deposition Time

Topography wafers (7000 Å, 1:1) were obtained from Interuniversity Micro-Electronic Center (IMEC), Belgium. FIGS. 5(a)-(e) are scanning electron microscope (SEM) photographs showing the progressive reduction of feature size after 3 minutes, 6 minutes, 9 minutes, 12 minutes, and 15 minutes, respectively, of deposition of 2-fluorotoluene on 7000 Å (1:1) topography wafers by the PECVD process. Table 2 sets forth the deposition time and feature size between two columns. Table 2 also shows the feature size reduction from 499 nm (blank 7000 Å topography wafer) to 390 nm after 15 minutes of deposition. As illustrated by these results, when the deposition time is increased, there is a reduction in the feature size between the columns of the trench.

TABLE 2

Reduction of Feature Size on 7000 Å Topography Wafers

Figure 5A:
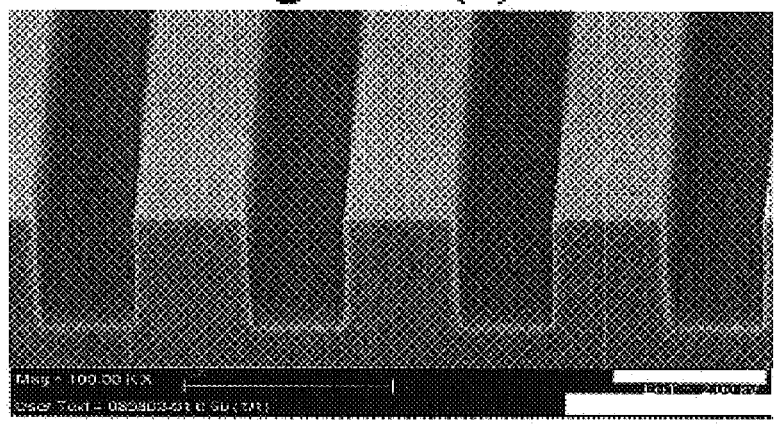
FIG. 5(a) is an SEM photograph showing the reduction of feature size after 3 minutes of deposition of 2-fluorotoluene on 7000 Å (1:1) topography wafers by the inventive PECVD process.
Figure 5B:
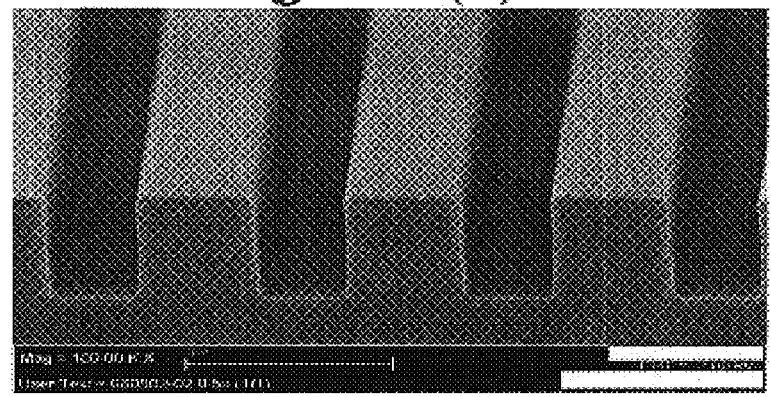
FIG. 5(b) is an SEM photograph showing the reduction of feature size after 6 minutes of deposition of 2-fluorotoluene on 7000 Å (1:1) topography wafers by the inventive PECVD process.
Figure 5C:
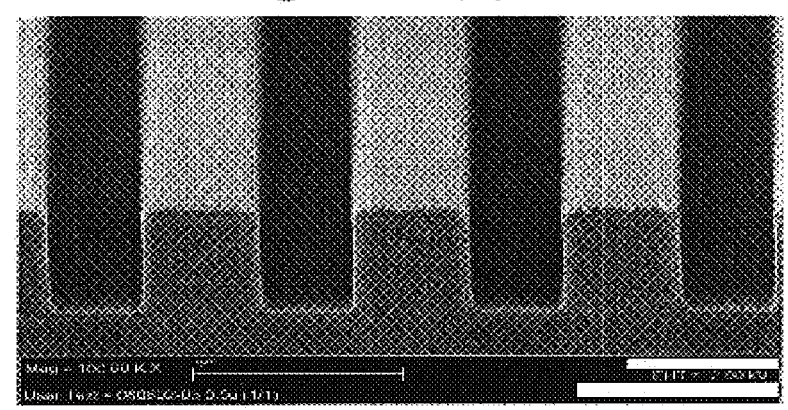
FIG. 5(c) is an SEM photograph showing the reduction of feature size after 9 minutes of deposition of 2-fluorotoluene on 7000 Å (1:1) topography wafers by the inventive PECVD process.
Figure 5D:
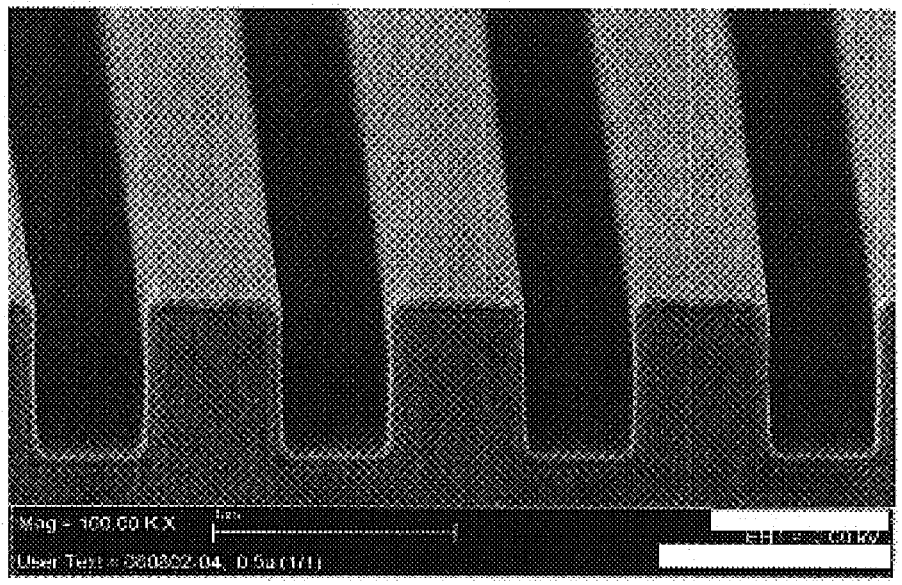
FIG. 5(d) is an SEM photograph showing the reduction of feature size after 12 minutes of deposition of 2-fluorotoluene on 7000 Å (1:1) topography wafers by the inventive PECVD process.
Figure 5E:
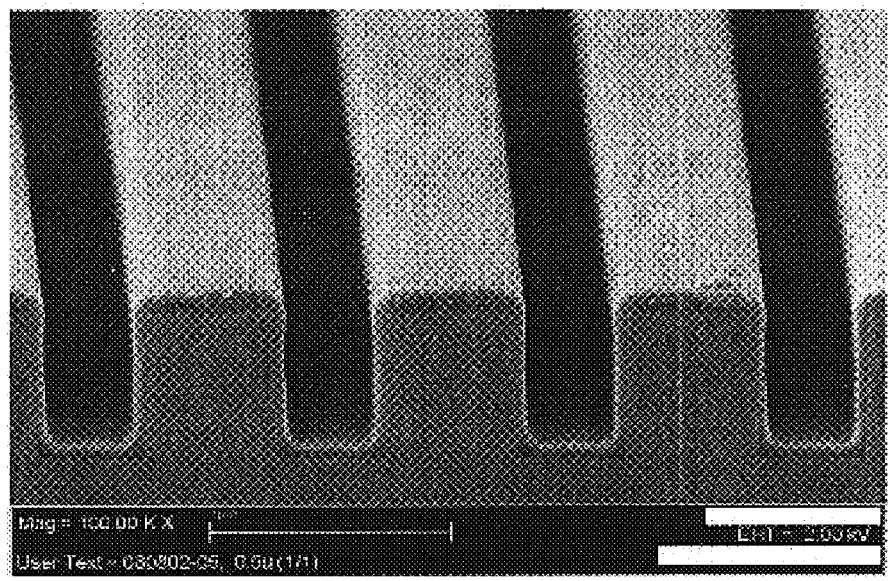
FIG. 5(e) is an SEM photograph showing the reduction of feature size after 15 minutes of deposition of 2-fluorotoluene on 7000 Å (1:1) topography wafers by the inventive PECVD process.

| Deposition time (min) | Feature size between 2 columns (nm) |
|---|---|
| 0 (original trench wafer) | 499 |
| 3 (FIG. 5(a)) | 481 |
| 6 (FIG. 5(b)) | 460 |
| 9 (FIG. 5(c)) | 451 |
| 12 (FIG. 5(d)) | 443 |
| 15 (FIG. 5(e)) | 390 |

Figure 6:
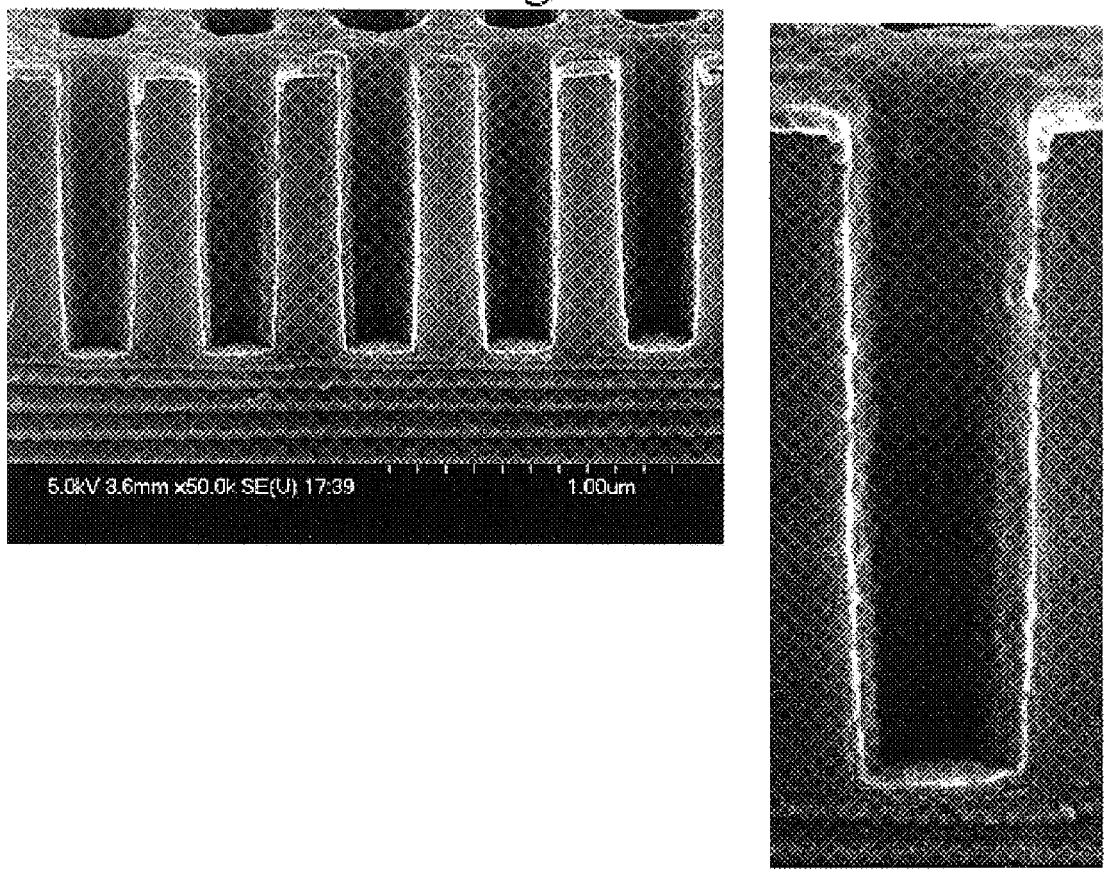
FIG. 6 is a photograph showing the reduction of feature size after deposition of parylene D on dense vias (1:1) by the inventive CVD process.

A polymeric thin film (comprising parylene D) was deposited on resist-patterned, blank via wafers by a CVD process. By controlling the deposition rate, the amount of pattern shrinkage was controlled to provide the desired final structure dimension. FIG. 6 is an SEM photograph showing the reduction in feature size after deposition of parylene D on the resist patterned dense vias (1:1) by the inventive CVD process.

Figure 7:
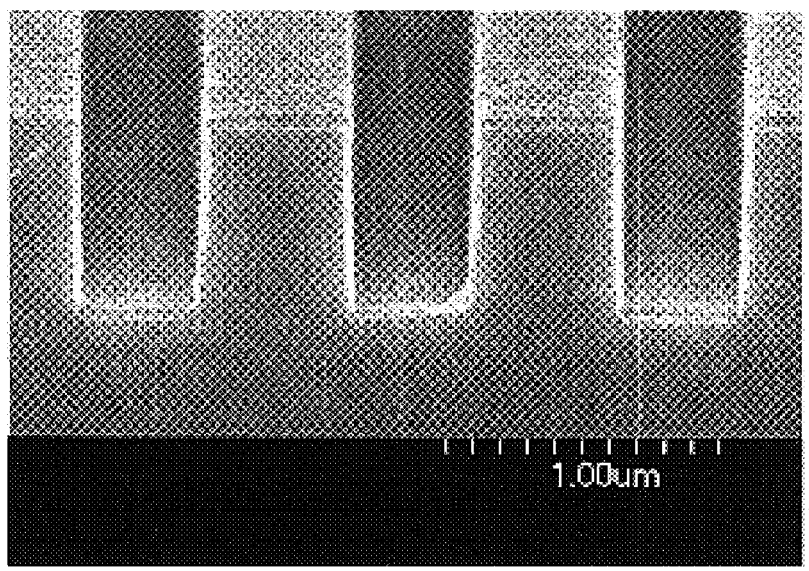
FIG. 7 is an SEM photograph the showing reduction of feature size after deposition of parylene D on 7000 Å (1:1) topography wafers by the inventive CVD process.

FIG. 7 is an SEM photograph showing the reduction in feature size after deposition of parylene D on 7000 Å (1:1) topography wafers by the inventive CVD process.

We claim:
1. A precursor structure comprising:
a substrate having a surface which includes topography formed therein, said topography comprising holes, trenches, or a combination of holes and trenches, said holes and trenches having respective sidewalls and bottomwalls and having respective initial, uncoated widths, said sidewalls having respective uppermost and lowermost points; and
a thin, uniform coating of organic material on said sidewalls and extending from said respective uppermost points to said respective lowermost points, said organic material comprising a quantity of monomers, said bottomwalls being substantially free of said coating, said holes, trenches, or combination of holes and trenches having coated sidewalls which have a second width, said width being smaller than said initial width,
wherein said monomers comprise a light attenuating compound selected from the group consisting of fluorotoluene, naphthalene, anthracene, furan, thiophene, pyrrole, pyridine, pyrimidine, pyrazine, thiazine, oxazine, acridine, thiazole, pyrazole, oxazole, quinazoline, and quinoxaline.

2. The structure of claim 1, wherein said substrate comprises a patterned substrate selected from the group consisting of photoresist layers, ion implant layers, dielectric layers, microelectronic wafers, microelectromechanical systems structures, and functional surfaces of microelectromechanical systems.

3. The structure of claim 1, wherein said coating on said sidewalls has a thickness of from about 10-2,000 Å.

4. The structure of claim 1, wherein said second width is at least about 5% smaller than said initial width.

5. The structure of claim 1, wherein said light attenuating compound includes a group selected from the group consisting of alkyl, aryl, alkoxy, alicyclic, hetaryl, halogens, cyano, ester, ether, aldehydes, ketones, alcohol, phenol, nitro, amines, amides, and acetamido groups.

6. The structure of claim 1, wherein said light attenuating compound comprises an organic chromophore attached to an atom selected from the group consisting of silicon, titanium, germanium, tin, tungsten, lead, iron, cobalt, copper, magnesium, manganese, nickel, phosphorous, and aluminum atoms.

7. A precursor structure comprising:
a substrate having a surface which includes raised features formed therein, said raised features having respective upper surfaces and sidewalls, said sidewalls cooperating with said substrate surface to form bottomwalls between said raised features, there being respective initial distances between the respective sidewalls adjacent features, said sidewalls having respective uppermost and lowermost points; and
a thin, uniform coating of organic material on said sidewalls and extending from said respective uppermost points to said respective lowermost points, said organic material comprising a quantity of monomers, said bottomwalls being substantially free of said coating, there being respective second distances between the coated sidewalls of adjacent features, said second distances being smaller than the initial distances corresponding thereto, wherein said monomers comprise a light attenuating compound selected from the group consisting of fluorotoluene, naphthalene, anthracene, furan, thiophene, pyrrole, pyridine, pyrimidine, pyrazine, thiazine, oxazine, acridine, thiazole, pyrazole, oxazole, quinazoline, and quinoxaline.

8. The structure of claim 7, wherein said substrate is selected from the group consisting of photoresist layers, ion implant layers, dielectric layers, microelectronic wafers, microelectromechanical systems structures, and functional surfaces of microelectromechanical systems.

9. The structure of claim 7, wherein said coating on said sidewalls has a thickness of from about 10-2,000 Å.

10. The structure of claim 7, wherein said second distance is at least about 5% smaller than said initial distance.

11. The structure of claim 7, wherein said light attenuating compound includes a group selected from the group consisting of alkyl, aryl, alkoxy, alicyclic, hetaryl, halogens, cyano, ester, ether, aldehydes, ketones, alcohol, phenol, nitro, amines, amides, and acetamido groups.

12. The structure of claim 7, wherein said light attenuating compound comprises an organic chromophore attached to an atom selected from the group consisting of silicon, titanium, germanium, tin, tungsten, lead, iron, cobalt, copper, magnesium, manganese, nickel, phosphorous, and aluminum atoms.

* * * * *